(12) United States Patent
Zhang et al.

(10) Patent No.: US 11,825,615 B2
(45) Date of Patent: Nov. 21, 2023

(54) COATED MEMBER, ELECTRONIC DEVICE, AND METHOD FOR MANUFACTURING THE COATED MEMBER

(71) Applicant: Fulian Yuzhan Precision Technology Co., Ltd, Shenzhen (CN)

(72) Inventors: Lei Zhang, Shenzhen (CN); Chung-Pei Wang, New Taipei (TW); An-Li Qin, New Taipei (TW)

(73) Assignee: Fulian Yuzhan Precision Technology Co., Ltd, Shenzhen (CN)

( * ) Notice: Subject to any disclaimer, the term of this patent is extended or adjusted under 35 U.S.C. 154(b) by 0 days.

(21) Appl. No.: 17/350,568

(22) Filed: Jun. 17, 2021

(65) Prior Publication Data
US 2021/0395879 A1  Dec. 23, 2021

(30) Foreign Application Priority Data
Jun. 17, 2020  (CN) .......................... 202010556493.2

(51) Int. Cl.
| | |
|---|---|
| *H05K 5/02* | (2006.01) |
| *C23C 14/00* | (2006.01) |
| *C23C 14/06* | (2006.01) |
| *C23C 14/35* | (2006.01) |
| *C23C 14/34* | (2006.01) |

(52) U.S. Cl.
CPC .......... *H05K 5/02* (2013.01); *C23C 14/0015* (2013.01); *C23C 14/0057* (2013.01); *C23C 14/0635* (2013.01); *C23C 14/0641* (2013.01); *C23C 14/0664* (2013.01); *C23C 14/34* (2013.01); *C23C 14/3464* (2013.01); *C23C 14/352* (2013.01); *Y10T 428/265* (2015.01); *Y10T 428/31678* (2015.04)

(58) Field of Classification Search
None
See application file for complete search history.

(56) References Cited

U.S. PATENT DOCUMENTS

| | | | | |
|---|---|---|---|---|
| 2004/0101709 A1* | 5/2004 | Chen | ....................... | C23C 28/04 428/626 |
| 2004/0241490 A1* | 12/2004 | Finley | ..................... | C23C 14/08 428/650 |

(Continued)

FOREIGN PATENT DOCUMENTS

CN           103241055 A      8/2013

*Primary Examiner* — Seth Dumbris
(74) *Attorney, Agent, or Firm* — ScienBiziP, P.C.

(57) ABSTRACT

A coated member, an electronic device, and a method for manufacturing the coated member are provided. The coated member comprises a substrate, a color layer formed on a surface of the substrate, and an interference layer formed on a surface of the color layer. A coordinate L* corresponding to a color space presented by the color layer in a CIE LAB color system is within a preset range. When the coordinates of L* are within the preset range, the color of the coated member may be the same or may be different from the color of the color layer. Light passes through the interference layer and then enters the color layer. The color layer reflects and refracts the light. The reflected light enters the interference layer. The interference layer interferes with the reflected light, so that the coated member appears to be a target color.

9 Claims, 9 Drawing Sheets

(56) References Cited

U.S. PATENT DOCUMENTS

2006/0286392 A1\* 12/2006 Lin ....................... C23C 28/341
 204/192.15
2007/0275264 A1\* 11/2007 Hultin ................. C23C 14/0015
 204/192.1
2009/0181262 A1\* 7/2009 Isaksson ................ B44F 1/045
 428/626

\* cited by examiner

COATED MEMBER, ELECTRONIC DEVICE, AND METHOD FOR MANUFACTURING THE COATED MEMBER

CROSS-REFERENCE TO RELATED APPLICATIONS

This application claims priority to Chinese Patent Application No. 202010556493.2 filed on Jun. 17, 2020, the contents of which are incorporated by reference herein.

FIELD

The subject relates to a coated member, an electronic device, and a method for manufacturing the coated member.

BACKGROUND

Housings of electronic devices may include a coated layer to provide a color to the housing. Many variables, such as composition, structure, thickness, and processing affect the color of the coated layer, so reproducing a true color of the coated layer on the housing is difficult to achieve in terms of controlling the process. The coated layer of blue, purple, gold, coffee, or khaki may have poor stability and difficulty in reproducibility.

BRIEF DESCRIPTION OF THE DRAWINGS

Implementations of the present technology will now be described, by way of example only, with reference to the attached figures.

DETAILED DESCRIPTION

Figure 1:
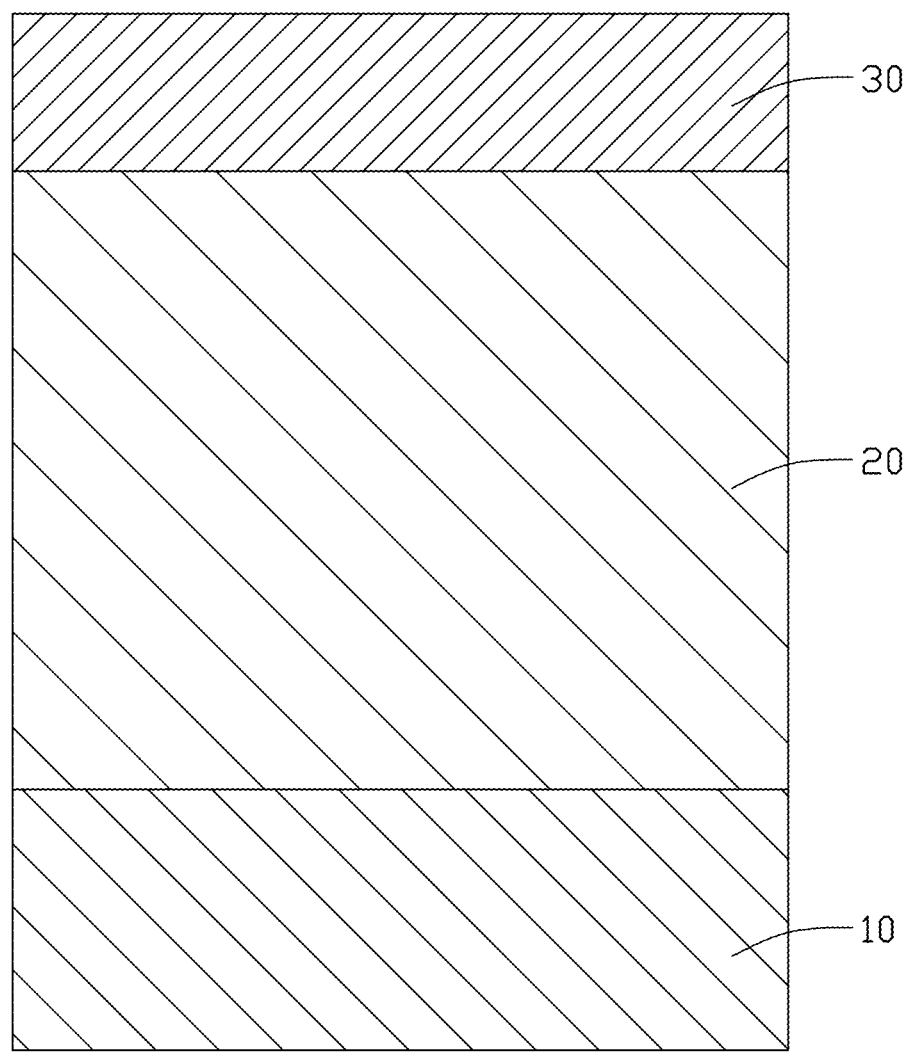
FIG. 1 is a cross-sectional view of an embodiment of a coated member.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. In the case of no conflict, the following embodiments and features in the embodiments can be combined with each other.

Referring to FIG. 1, a coated member 100 is provided in an embodiment. The coated member 100 includes a substrate 10, a color layer 20, and an interference layer 30. The color layer 20 is formed on a surface of the substrate 10. The interference layer 30 is formed on a surface of the color layer 20. Light passes through the interference layer 30 and then enters the color layer 20. The color layer 20 reflects and refracts the light. The reflected light enters the interference layer 30. The interference layer 30 interferes with the reflected light, so that the coated member 100 appears to be a target color. After determining a composition of the color layer 20 and the interference layer 30, a thickness of the interference layer 30 of the coated member 100 can be changed, so that the interference layer 30 can apply interference to the light reflected from the color layer 20. A refraction coefficient and a light extinction coefficient of the coated member 100 can thus be adjusted to improve an appearance and a color accuracy of the coated member 100, together with greater color diversity.

When the light irradiates on the interference layer 30, a part of the light is reflected from the surface of the interference layer 30, and other portion of the light enters the interference layer 30. A part of the light entering the interference layer 30 is reflected at a junction of the interference layer 30 and the color layer 20 and refracted again on the surface of the interference layer 30. The interference between the two kinds of reflected light can strengthen or weaken the reflected light, so that the coated member 100 can present a final color. Since natural light is polychromatic light, and includes light with multiple wavelengths, the interference layer 30 interferes in a different way with each wavelength of light. For example, when green light is offset, the light may appear as magenta, which is complementary to the green light.

Thus, different wavelengths of the light are offset by changing the thickness of the interference layer 30, so that the color of the coated member 100 can be changed in a wider color space. With the change of the thickness of the interference layer 30, the coated member 100 may successively exhibit different colors such as yellow, red, blue, and green, and return to the yellow color to show a wider color space.

The substrate 10 can be made of stainless steel, aluminum, glass, ceramics, or plastics. The material can be selected and adjusted according to the actual requirements.

The color layer 20 can be at least one of a chromium carbon (CrC) layer, a chromium carbon nitride (CrCN) layer, and a chromium silicon carbon nitride (CrSiCN) layer. The color layer 20 can be a single layer structure, that is, made of only a chromium carbon (CrC) layer or a chromium silicon carbon nitride (CrSiCN) layer, or the like. The color layer 20 can also be a composite layer, that is, made of the color layer 20 that is composed of two chromium carbon (CrC) layers, two chromium silicon carbon nitride (CrSiCN) layers, or a chromium carbon (CrC) layer and a chromium silicon carbon nitride (CrSiCN) layer or the like. The color layer 20 must include the chromium atoms and the carbon atoms, a mass ratio of the carbon atoms in the color layer 20 must be 20% to 60% and a coordinate L* of the color layer 20 in a CIE LAB color system must be in a range of 40≤L*≤60. The value of L* in the CIE LAB color system can be measured with a spectrophotometer, such as KONICA MINOLTA, INC. SE2000 or NIPPON DENSHOKU INDUSTRIES Co. LTD. SD7000 and other equipment. According to the CIE LAB color system, the coordinate L* represents degrees of lightness and darkness; a* represents a range from red to green, a positive value of a* represents a degree of reddishness, a negative value of a* represents a degree of greenishness; b* represents a range from yellow to blue, a positive value of b* represents a degree of yellowishness, and a negative value of b* represents a degree of bluishness. The three values of L*, a*, and b* combine to determine a particular color.

The color layer 20 includes chromium atoms (Cr), for example, the color layer 20 can be a chromium carbon (CrC) layer, a chromium carbon nitride (CrCN) layer, or a chromium silicon carbon nitride (CrSiCN) layer. Thus, the color layer 20 can have a stronger bonding strength with various forms of atoms on the surface of the substrate 10. Thus, the color layer 20 can be firmly bonded to the surface of the substrate 10 to further increase a density of a film structure (that is the color layer 20 and interference layer 30), so that a coated member 100 with wider color space and with more stable and softer colors is obtained. At the same time, the coordinate L* of the color layer 20 may affect an overall gloss after the interference layer 30 is formed. When the coordinate L* is smaller or larger, the gloss of the coated member 100 formed after the interference layer 30 is coated may be less or more gloss, and the gloss may be uneven. Less or more gloss may cause a* value not obvious enough, and even linear change of unity may occur. The brightness of the color layer 20 directly affects the chromaticity of the interference layer 30 after the light is reflected by the color layer 20 and interfered with by the interference layer 30, and further affects the color of the coated member 100, thus causing the coated member 100 not being able to exhibit a more obvious color space change with the thickness of the coated member 100.

The color of the color layer 20 is used as a basic background color. While the stability and the compactness of the film structure are ensured, the color layer 20 can selectively re-reflect and refract the natural light entering the interference layer 30 according to its own color characteristics; and the interference layer 30 then interferes with the light reflected from the color layer 20, thus allowing the coated member 100 to present the final color. By changing the thickness of the interference layer 30, the color layer 20 with a single color allows the coated member 100 to present the final color that is the same or different from the color layer 20, when the light is interfered with by the interference layer 30.

In some embodiments, the interference layer 30 includes aluminum atoms, titanium atoms, and nitrogen atoms. Aluminum nitride (AlN) has a good conductivity and a wide band gap (6.2 eV), which has a crystal phase structure with less difference between crystal orientations. Thus, the structure of AlN is different from that of the non-conductive $Al_2O_3$ ceramic, allowing more lights to enter the interference layer 30 and be reflected on the surface of the color layer 20. The crystal phase structure maintains the uniformity of glossiness of the light reflected by the color layer 20 when passing through the interference layer 30, and also has good transmittance and transmission of visible light reflected by the color layer 20, thus enhancing the interference offset effect of the interference layer 30 on the light. A mass ratio of the aluminum and the titanium in the interference layer 30 is in a range from 2.5:7 to 3.5:7. As such, the interference layer 30 can have a higher interference with the light and a high chemical stability. The titanium (Ti) in the range that increases a number of active atoms on the surface in the AlN crystal phase to increase the surface energy. Also, by a uniform diffusion between the aluminum atoms and the titanium atoms, the AlN crystal phase structure has an effective thickness and a high stability, and the light transmittance of the AlN crystal phase increases, thus more light enters the color layer 20 and is reflected. If the light reflected by the color layer 20 has high glossiness, after the light reflects and enters the interference layer 30, the color of the coated member 100 may be more vivid, since the AlTiN structure of the interference layer 30 absorbs light in a wider frequency range and has a higher absorption rate. If the mass ratio of the Al is too high, the film structure may be corroded. If the mass ratio of the Al is too small, the surface flatness of the film structure is affected, thus weakening the interference effect and the color change ability, thus the color of the coated member 100 closes to white or black.

In some embodiments, the interference layer 30 further includes silicon atoms. The silicon atoms can refine a size of crystal grains, so that the surface of the film tends to be flat, which facilitates the refraction and reflection of light and improves the interference performed by the interference layer 30.

Figure 2:
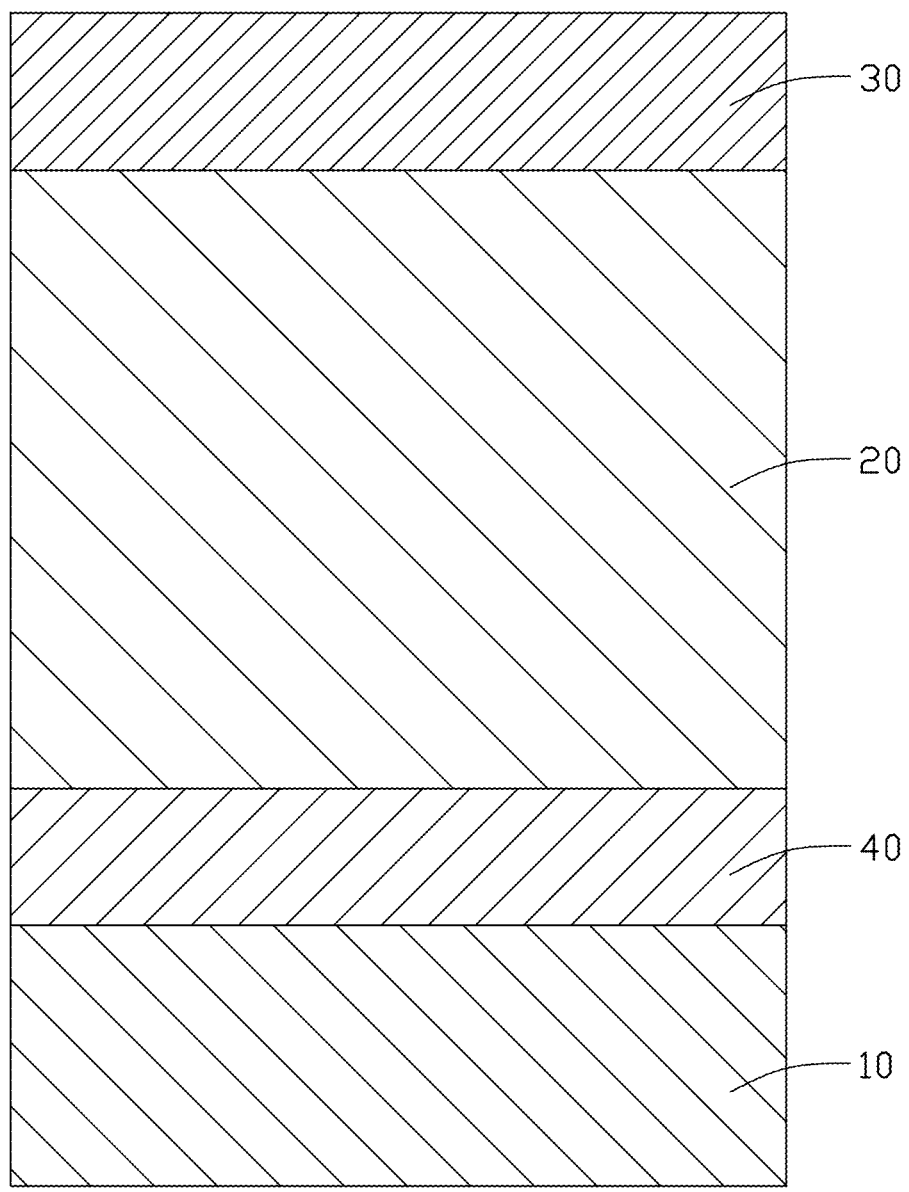
FIG. 2 is a cross-sectional view of another embodiment of a coated member.

Referring to FIG. 2, in some embodiments, the coated member 100 further includes a bonding layer 40. The bonding layer 40 is formed between the substrate 10 and the color layer 20 to improve the adhesion between the color layer 20 and the substrate 10. The bonding layer 40 may be a chromium (Cr) layer or a titanium (Ti) layer. In some embodiments, the bonding layer 40 is the chromium (Cr) layer. Since the chromium (Cr) has a stronger atomic polarity, the bonding strength of atoms and molecules between the substrate 10 and the color layer 20 is stronger.

In some embodiments, a thickness of the color layer 20 is 0.2 μm to 1.5 μm. A thickness of the interference layer 30 is 20 nm to 100 nm. The thickness of the color layer 20 and the interference layer 30 can be selected and adjusted according to actual requirements. By changing the thickness of the interference layer 30, different colors of the coated member 100 can be obtained. For example, when the thickness of the interference layer 30 is progressively changed from 20 nm to 100 nm, the color presented by the coated member 100 changes from yellow to red, and then from red to blue, and then from blue to green, and finally from green to yellow, in the CIE LAB color system. wherein when the thickness of the interference layer 30 gradually increases from 20 nm to 30 nm, the a* value of the coated member 100 in the CIE LAB color system gradually increases within a first color scale, and the b* value is within a second color scale; wherein when the thickness of the interference layer 30 gradually increases from 30 nm to 40 nm, the a* value of the coated member 100 in the CIE LAB color system is within a third color scale, and the b* value gradually decreases within a fourth color scale; when the thickness of the interference layer 30 gradually increases from 40 nm to 60 nm, the a* value of the coated member 100 in the CIE LAB color system gradually decreases within a fifth color scale, and the b* value is within a sixth color scale; when the thickness of the interference layer 30 gradually increases from 60 nm to 80 nm, the a* value of the coated member 100 in the CIE LAB color system is within a seventh color scale, and the b* value gradually increases within an eighth color scale; and when the thickness of the interference layer 30 gradually increases from 80 nm to 100 nm, the a* value of the coated member 100 in the CIE LAB color system gradually increases within a ninth color scale, and the b* value is within a tenth color scale.

Figure 3:
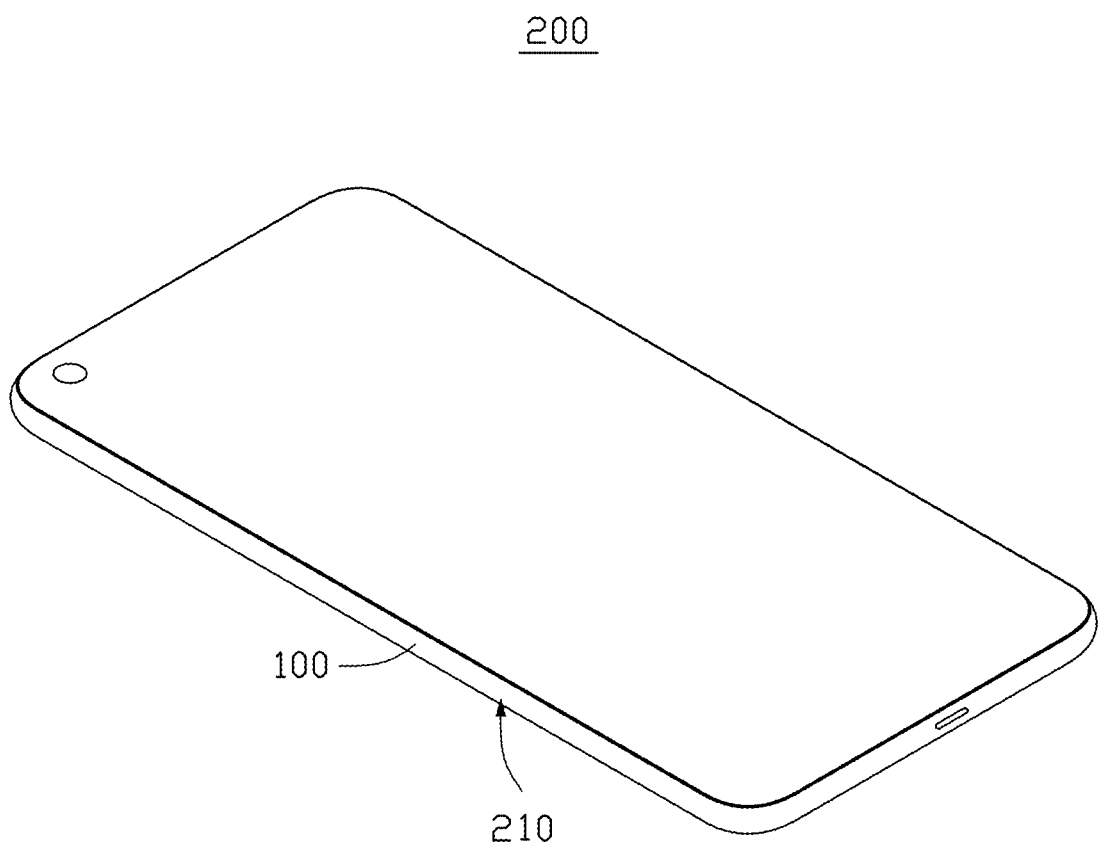
FIG. 3 is a schematic view of an embodiment of an electronic device.

Referring to FIG. 3, in some embodiments, an electronic device 200 is provided. The electronic device 200 includes a housing 210, and the housing 210 includes the coated member 100.

Figure 4:
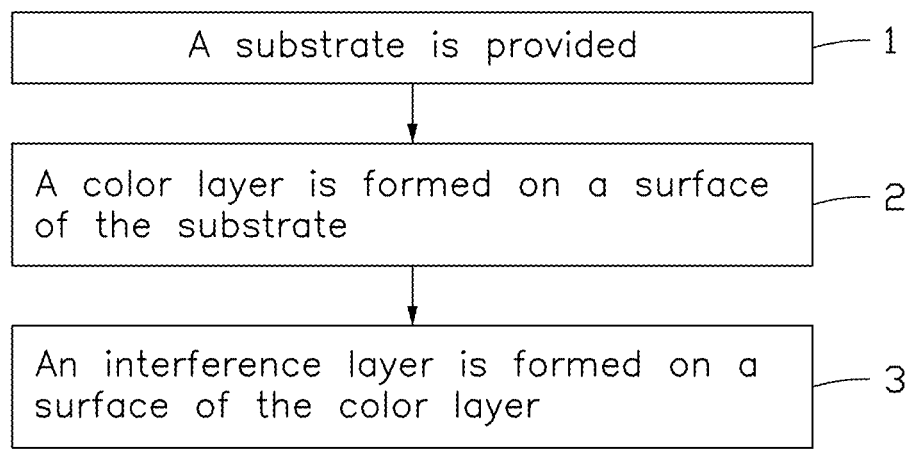
FIG. 4 is a flowchart of an embodiment of a method for manufacturing the coated member.

A method for manufacturing of the coated member 100 is provided in some embodiments. The method is provided by way of example, as there are a variety of ways to carry out the method. Referring to FIG. 4, the method can begin at block 1.

In block 1, a substrate 10 is provided. The substrate 10 can be made of stainless steel, aluminum, glass, ceramic or plastic, which can be selected and adjusted according to actual requirements.

In block 2, a color layer 20 is formed by coating on a surface of the substrate 10. The color layer 20 can be deposited and formed on a surface of the substrate 10 by a method of magnetron sputtering. The color layer 20 can be made at least one of a chromium carbon (CrC) layer, a chromium carbon nitride (CrCN) layer, and a chromium silicon carbon nitride (CrSiCN) layer. As long as the color coordinate L* of the color layer 20 in a CIE LAB color system is within a range of 40≤L*≤60.

In block 3, an interference layer 30 with a predetermined thickness is formed by coating on a surface of the color layer 20. Magnetron sputtering is performed on the substrate 10 by using an aluminum target and a titanium target and introducing argon gas and nitrogen gas to form an interference layer 30 including aluminum atoms, titanium atoms, and nitrogen atoms. And a mass ratio of aluminum atoms to titanium atoms is in a range from 2.5:7 to 3.5:7, so that the coated member 100 with a single target color is finally obtained.

In block 3, during the formation of the interference layer 30, a preset thickness of the interference layer 30 can be adjusted by changing a current intensity of the aluminum target or the titanium target, or adjusting an applied voltage intensity to the substrate 10, a nitrogen gas flow rate, or a coating time and other coating conditions. The final color of the coated member 100 can be changed according to the preset thickness of the interference layer 30, thus obtain the coated member 100 with a target color.

Figure 5:
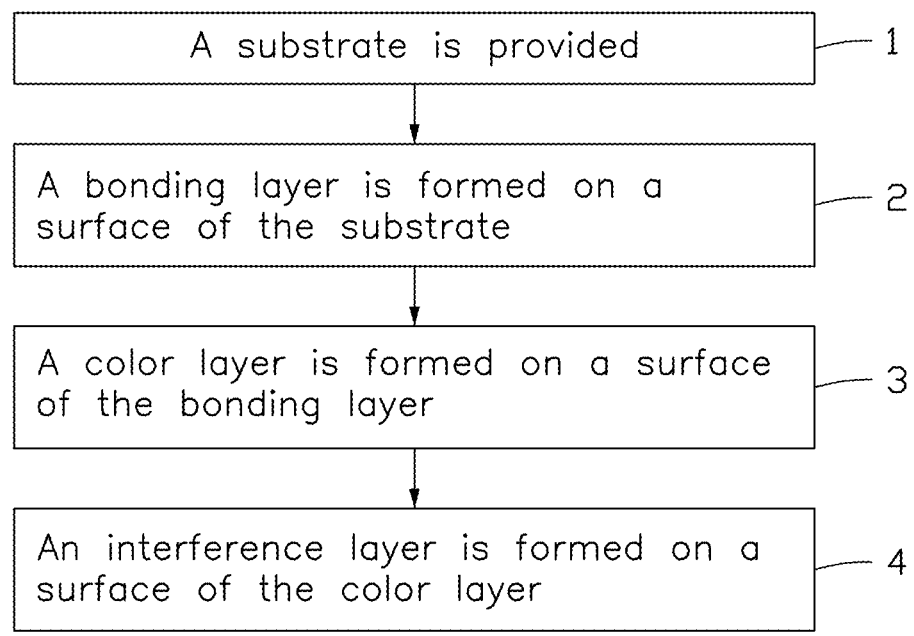
FIG. 5 is a flowchart of another embodiment of a method for manufacturing the coated member.

Referring to FIG. 5, another method for manufacturing of the coated member 100 is provided to further improve the density and flatness, reduce a friction resistance, and improve a mechanical performance and stability of the coated member 100.

In block 1, a substrate 10 is provided. The substrate 10 can be made of stainless steel, aluminum, glass, ceramic or plastic, which can be selected and adjusted according to actual requirements.

In block 2, a bonding layer 40 is formed by coating on a surface of the substrate 10. The bonding layer 40 is one of a chromium (Cr) layer or a titanium (Ti) layer.

In block 3, a color layer 20 is formed by coating on a surface of the bonding layer 40. The color layer 20 can be deposited and formed on a surface of the substrate 10 by a method of magnetron sputtering. The color layer 20 can be at least one of a chromium carbon (CrC) layer, a chromium carbon nitride (CrCN) layer, and a chromium silicon carbon nitride (CrSiCN) layer. As long as the color coordinate L* of the color layer 20 in a CIE LAB color system is within a range of 40≤L*≤60.

In block 4, an interference layer 30 with a predetermined thickness is formed by coating on a surface of the color layer 20. Magnetron sputtering is performed on the substrate 10 by using an aluminum target, a titanium target, and a silicon target, and introducing argon gas and nitrogen gas to form an interference layer 30 including aluminum atoms, titanium atoms, nitrogen atoms, and silicon atoms. And a mass ratio of aluminum atoms to titanium atoms is in a range from 2.5:7 to 3.5:7, so that the coated member 100 with a single target color is finally obtained.

In block 4, during the formation of the interference layer 30, a preset thickness of the interference layer 30 can be adjusted by changing a current intensity of the aluminum target, the titanium target, or the silicon target, or adjusting an applied voltage intensity to the substrate 10, a nitrogen gas flow rate, or a coating time and other coating conditions. The final color of the coated member 100 can be changed according to the preset thickness of the interference layer 30, thus the coated member 100 with a target color is obtained.

The present disclosure will be described in detail through some embodiments. The following embodiments take the housing 210 coating of electronic devices 200 as examples, such as mobile phones, tablet computers, etc. The present disclosure is not limited to the following embodiments of electronic devices 200.

Example 1

The substrate 10 was stainless steel.

Coated chromium (Cr) bonding layer 40: using a chromium target, the current of the chromium target was 10 A, a duty ratio was adjusted to 70%, and a bias voltage of 200V was applied to the substrate 10. Continuously inject nitrogen gas at a flow rate of 20 mL/min into a coating chamber. A time for coating the bonding layer 40 was 20 min.

Coated chromium carbon (CrC) color layer 20: using a chromium target, the current of the chromium target was 10 A, the duty ratio was adjusted to 50%, and a bias voltage of 100V was applied to the substrate 10. Continuously inject acetylene gas at a flow rate of 105 mL/min into a coating chamber. A time for coating the color layer 20 was 140 min, thus a gray coated member 100 having only the color layer 20 was obtained.

The values of the color of a long side of the coated member 100: L* is 51.10, a* is 0.21, and b* is 0.43; the values of the color of a short side of the coated member 100: L* is 49.87, a* is −0.04, and b* is 0.28.

Comparative Example 1

On a basis of example 1, an aluminum titanium nitride (AlTiN) interference layer 30 was coated on the chromium carbon (CrC) color layer 20: using an aluminum target and a titanium target, the current of the aluminum target was 10 A, the current of the titanium target was 8 A, and the duty ratio was adjusted to 50%, and a bias voltage of 150V was applied to the substrate 10. Continuously inject nitrogen gas at a flow rate of 70 mL/min into a coating chamber. A time for coating the interference layer 30 was 140 min.

The process parameters of example (short to Ex) 1 and comparative example (short to Co-ex) 1 were shown in Table 1.

flow rate of 80 mL/min, and argon gas at a flow rate of 300 mL/min into a coating chamber. A time for coating the interference layer 30 was 140 min.

TABLE 1

|  | | chromium target (A) | aluminum target (A) | titanium target (A) | silicon target (A) | time (min) | duty ratio (%) | bias voltage (V) | nitrogen (ml/min) | argon (ml/min) | acetylene (ml/min) |
| --- | --- | --- | --- | --- | --- | --- | --- | --- | --- | --- | --- |
| bonding layer (Cr) | | | | | | | | | | | |
| | Ex 1 | 10 | | | | 20 | 70 | 200 | 20 | | |
| | Co-ex 1 | 10 | | | | 20 | 70 | 200 | 20 | | |
| color layer (CrC) | | | | | | | | | | | |
| | Ex 1 | 10 | | | | 140 | 50 | 100 | | | 105 |
| | Co-ex 1 | 10 | | | | 140 | 50 | 100 | | | 105 |
| interference layer | | | | | | | | | | | |
| | Ex 1 | | | | | | | | | | |
| | Co-ex 1 | | 10 | 8 | | 140 | 50 | 150 | 70 | | |

Figure 6:
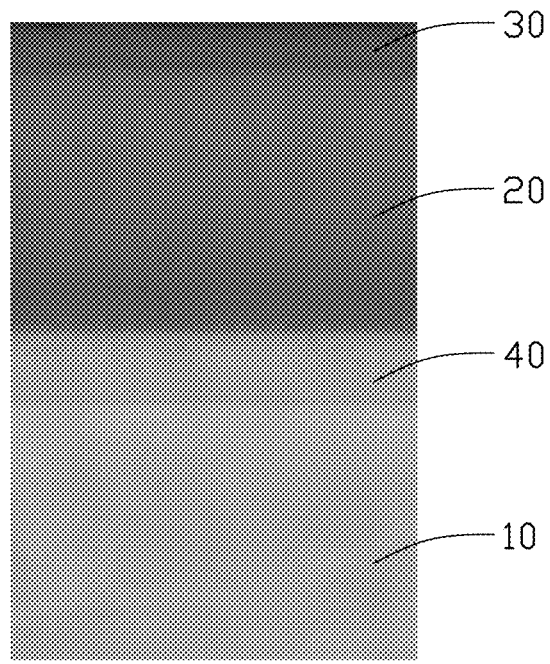
FIG. 6 is a scanning electron microscope image of a coated member in comparative example 1.
Figure 7:
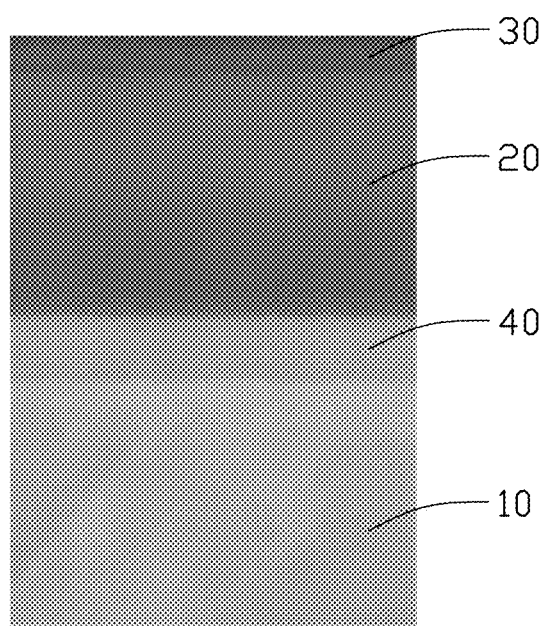
FIG. 7 is another scanning electron microscope image of a coated member in comparative example 1.

Referring to FIGS. 6 to 7, FIG. 6 is a scanning electron microscope image of the coated member 100 in comparative example 1; FIG. 7 is another scanning electron microscope image of the coated member 100 in comparative example 1. It can be seen from FIGS. 6 to 7 that the substrate 10, the bonding layer 40, the color layer 20, and the interference layer 30 are arranged sequentially from bottom to top.

The values of the color of the long side of the coated member 100: $L^*$ is 55.40, $a^*$ is −3.19, $b^*$ is 7.12; the values of the color of the short side of the coated member 100: $L^*$ is 54.85, $a^*$ is −72.2, and $b^*$ is 25.6. The $a^*$ is a negative value and greenish. That is, the coated member 100 of comparative example 1 is emerald green after being coated with the aluminum titanium nitride (AlTiN) interference layer 30, which has a significant change compared with the gray chromium carbon (CrC) color layer 20. That is, the interference layer 30 covered on the color layer 20, it can cooperate with the color layer 20 to interfere and reflect light, so that the color presented by the coated member 100 changes, thereby obtaining the coated member 100 of the target color.

Example 2

The substrate 10 was stainless steel. The bonding layer 40 was a chromium layer, and the color layer 20 was a chromium carbon nitride layer (CrCN).

Coated chromium carbon nitride (CrCN) color layer 20: using a chromium target, the current of the chromium target was 10 A, the duty ratio was adjusted to 50%, and a bias voltage of 100V was applied to the substrate 10. Continuously inject acetylene gas at a flow rate of 105 mL/min, nitrogen gas at a flow rate of 20 mL/min, and argon gas at a flow rate of 200 mL/min into a coating chamber. A time for coating the color layer 20 was 140 min. The color space range presented by the color layer 20 with long side $L^*$ is 52.8, and short side $L^*$ is 50.4.

Coated aluminum titanium nitride (AlTiN) interference layer 30 (not containing silicon): using an aluminum target and a titanium target, a current of the aluminum target was 10 A, a current of the titanium target was 8 A, a duty ratio was adjusted to 50%, and a bias voltage of 150V was applied to the substrate 10. Continuously inject nitrogen gas at a Comparative Example 2

A difference of the parameters between comparative example 2 and example 2 in coating of interference layer 30 is that: using the aluminum target, the titanium target and a silicon target, the current of the aluminum target was 10 A, the current of the titanium target was 8 A, a current of the silicon target was 2 A, an aluminum titanium silicon nitride (AlTiSiN) interference layer 30 was formed.

Detecting the coated members 100 of example 2 and comparative example 2 respectively, an atomic percentage (At %) of the elements in the interference layer 30 were shown in Table 2.

TABLE 2

| | aluminum | titanium | nitrogen | oxygen | chromium | carbon | silicon |
| --- | --- | --- | --- | --- | --- | --- | --- |
| Ex 2 | 22.9 | 28.6 | 41.7 | 6.4 | 6.4 | 0.4 | 0 |
| Co-ex 2 | 23.2 | 28.2 | 39.9 | 6.2 | 6.6 | 0.5 | 1.6 |

Figure 8:
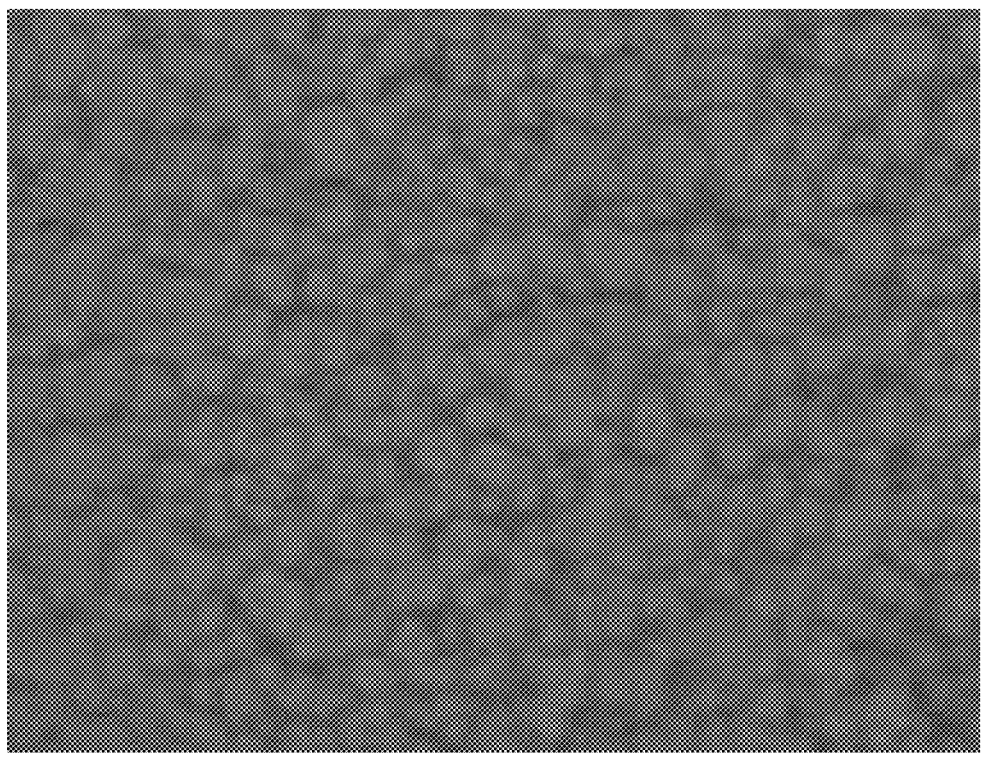
FIG. 8 is a scanning electron microscope image of a coated member in example 2.
Figure 9:
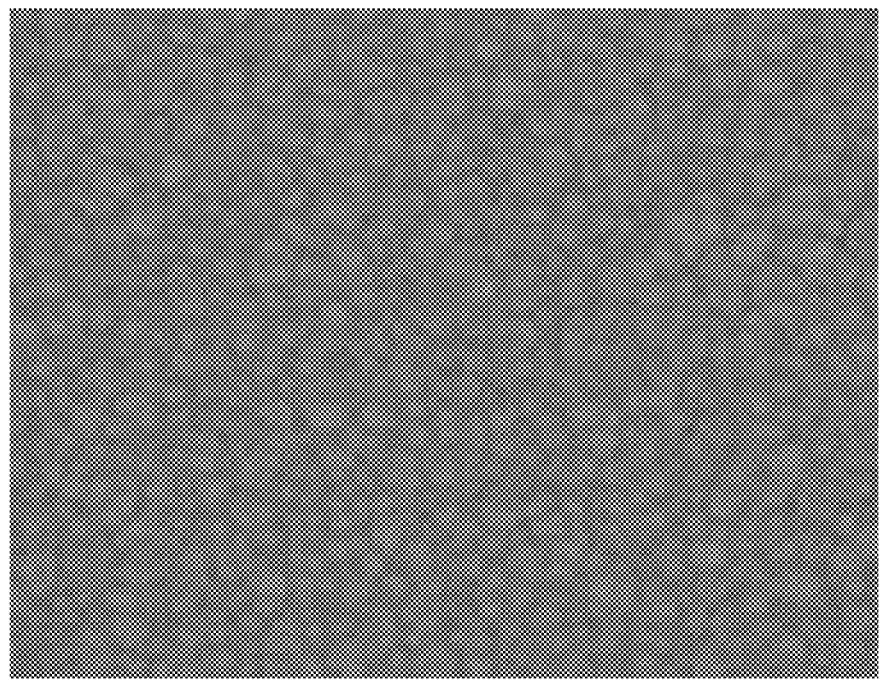
FIG. 9 is a scanning electron microscope image of a coated member in comparative example 2.

Referring to FIGS. 8 to 9, FIG. 8 is a scanning electron microscope image of a coated member in example 2; FIG. 9 is a scanning electron microscope image of a coated member in comparative example 2. It can be seen from FIGS. 8 to 9 that silicon is added, the density and flatness of the interference layer 30 are greatly improved, that is, the addition of silicon can promote the surface of the film tend to be flat.

Example 3

A difference of the parameters between example 3 and comparative example 2 in coating of AlTiSiN interference layer 30 is that: the current of the silicon target was 4 A. Coated aluminum titanium silicon nitride (AlTiSiN) interference layer 30: using the aluminum target, the titanium target and the silicon target, the current of aluminum target was 10 A, the current of titanium target was 8 A, and the current of silicon target was 4 A, the duty ratio was adjusted to 50%, and the bias voltage of 150V was applied to the substrate 10. Continuously inject nitrogen gas at a flow rate of 80 mL/min, and argon gas at a flow rate of 300 mL/min into a coating chamber. A time for coating the interference layer 30 was 140 min.

Example 4

A difference of the parameters between example 4 and example 3 in coating of AlTiSiN interference layer 30 is that: using the aluminum target, the titanium target and the silicon target, and the current of silicon target was 3 A.

Example 5

A difference of the parameters between example 5 and example 3 in coating of AlTiSiN interference layer 30 is that: using the aluminum target, the titanium target and the silicon target, and the current of silicon target was 1 A.

The process parameters of example 2 to 5 and comparative example 2 were shown in Table 3.

negative value of a* of the coated member 100 without adding silicon (example 2) and shows a certain regular change as the content of silicon changes. It shows that the addition of silicon, the degree of greenish color of the coated member 100 increases, and the degree to which the light complementary to the green is offset by interference increases. That is, silicon can increase the interference effect of the interference layer 30.

Comparative Example 3

A difference of the parameters between comparative example 3 and comparative example 2 is that: comparative example 3 does not include the chromium carbon nitride (CrCN) color layer 20, and the aluminum titanium silicon nitride (AlTiSiN) interference layer 30 is directly coated on the surface of the bonding layer 40. That is, using the aluminum target, the titanium target and the silicon target, the current of the aluminum target was 10 A, the current of

TABLE 3

|  | | chromium target (A) | aluminum target (A) | titanium target (A) | silicon target (A) | time (min) | duty ratio (%) | bias voltage (V) | nitrogen (ml/min) | argon (ml/min) | acetylene (ml/min) |
| --- | --- | --- | --- | --- | --- | --- | --- | --- | --- | --- | --- |
| bonding layer (Cr) | | | | | | | | | | | |
| | Ex 2 | 10 | | | | 20 | 70 | 200 | 20 | | |
| | Ex 3 | 10 | | | | 20 | 70 | 200 | 20 | | |
| | Ex 4 | 10 | | | | 20 | 70 | 200 | 20 | | |
| | Ex 5 | 10 | | | | 20 | 70 | 200 | 20 | | |
| | Co-ex 2 | 10 | | | | 20 | 70 | 200 | 20 | | |
| color layer (CrCN) | | | | | | | | | | | |
| | Ex 2 | 10 | | | | 140 | 50 | 110 | 20 | 200 | 105 |
| | Ex 3 | 10 | | | | 140 | 50 | 110 | 20 | 200 | 105 |
| | Ex 4 | 10 | | | | 140 | 50 | 110 | 20 | 200 | 105 |
| | Ex 5 | 10 | | | | 140 | 50 | 110 | 20 | 200 | 105 |
| | Co-ex 2 | 10 | | | | 140 | 50 | 110 | 20 | 200 | 105 |
| interference layer | | | | | | | | | | | |
| | Ex 2 | | 10 | 8 | | 140 | 50 | 150 | 80 | 300 | |
| | Ex 3 | | 10 | 8 | 4 | 140 | 50 | 150 | 80 | 300 | |
| | Ex 4 | | 10 | 8 | 3 | 140 | 50 | 150 | 80 | 300 | |
| | Ex 5 | | 10 | 8 | 1 | 140 | 50 | 150 | 80 | 300 | |
| | Co-ex 2 | | 10 | 8 | 2 | 140 | 50 | 150 | 80 | 300 | |

The values of color of the coated members 100 of examples 2 to 5 and comparative example 2 were detected respectively. The values of color of the coated members 100 were shown in Table 4.

TABLE 4

|  | long side L* | long side a* | long side b* | short side L* | short side a* | short side b* |
| --- | --- | --- | --- | --- | --- | --- |
| Ex 3 | 53.48 | −16.91 | 5.31 | 53.65 | −16.23 | 7.65 |
| Ex 4 | 53.5 | −12.5 | 4.94 | 52.7 | −14.26 | 3.22 |
| Co-ex 2 | 53.92 | −4.21 | 2.94 | 53.12 | −3.52 | 3.14 |
| Ex 5 | 54.92 | −5.15 | 1.49 | 54.47 | −4.89 | 2.78 |
| Ex 2 | 55.6 | −1.9 | 1.32 | 55.77 | −1.36 | 1.16 |

The data in Table 4 are arranged by a content of silicon from high to low (that is the current of silicon target from high to low). The negative value of a* of the coated member 100 after adding silicon is significantly smaller than the the titanium target was 8 A, the current of the silicon target was 2 A, the duty ratio was adjusted to 50%, and the bias voltage of 150V was applied to the substrate 10. Continuously inject nitrogen gas at a flow rate of 80 mL/min, and argon gas at a flow rate of 300 mL/min into the coating chamber. The time for coating the interference layer 30 was 140 min.

Comparative Example 4

A difference of the parameters between comparative example 4 and comparative example 3 in coating of AlTiSiN interference layer 30 is that: the time for coating the interference layer 30 was 150 min.

Comparative Example 5

A difference of the parameters between comparative example 5 and comparative example 3 in coating of AlTiSiN interference layer 30 is that: the time for coating the interference layer 30 was 160 min.

Comparative Example 6

A difference of the parameters between comparative example 6 and comparative example 3 in coating of AlTiSiN interference layer 30 is that: using the aluminum target, the titanium target and the silicon target, and the current of silicon target was 3 A.

Comparative Example 7

A difference of the parameters between comparative example 7 and comparative example 3 in coating of AlTiSiN interference layer 30 is that: using the aluminum target, the titanium target and the silicon target, and the current of silicon target was 4 A.

The process parameters of comparative examples 2 to 7 were shown in Table 5.

According to the Table 6, the content of silicon in comparative examples 2 to 5 are same. The coated members 100 in comparative examples 3 to 5 without the color layer 20, the color system values presented by the coated members 100 in comparative examples 3 to 5 are significantly different from the color system values presented in comparative example 2. As the coating time increases, the thickness of the interference layer 30 increases, and the coordinate L* of the coated member 100 is larger and brighter, and the negative value of a* becomes smaller and smaller, which is more greenish. But only a single color system and brightness superposition will appear, and a certain regularity and multi-color system color changes cannot be presented.

According to the Table 6, the time of coating in comparative examples 2, 3, 6 and 7 are same. The coated members 100 in comparative examples 3, 6, and 7 without the color layer 20. As the content of silicon increases, the thickness of the interference layer 30 increases, the coordinate of L* becomes larger and brighter, and the positive value of a*

TABLE 5

|  |  | chromium target (A) | aluminum target (A) | titanium target (A) | silicon target (A) | time (min) | duty ratio (%) | bias voltage (V) | nitrogen (ml/min) | argon (ml/min) | acetylene (ml/min) |
|---|---|---|---|---|---|---|---|---|---|---|---|
| bonding layer (Cr) | | | | | | | | | | | |
| | Co-ex 2 | 10 | | | | 20 | 70 | 200 | 20 | | |
| | Co-ex 3 | 10 | | | | 20 | 70 | 200 | 20 | | |
| | Co-ex 4 | 10 | | | | 20 | 70 | 200 | 20 | | |
| | Co-ex 5 | 10 | | | | 20 | 70 | 200 | 20 | | |
| | Co-ex 6 | 10 | | | | 20 | 70 | 200 | 20 | | |
| | Co-ex 7 | 10 | | | | 20 | 70 | 200 | 20 | | |
| color layer (CrCN) | | | | | | | | | | | |
| | Co-ex 2 | 10 | | | | 140 | 50 | 110 | 20 | 200 | 105 |
| | Co-ex 3 | | | | | | | | | | |
| | Co-ex 4 | | | | | | | | | | |
| | Co-ex 5 | | | | | | | | | | |
| | Co-ex 6 | | | | | | | | | | |
| | Co-ex 7 | | | | | | | | | | |
| interference layer (AlTiSiN) | | | | | | | | | | | |
| | Co-ex 2 | | 10 | 8 | 2 | 140 | 50 | 150 | 80 | 300 | |
| | Co-ex 3 | | 10 | 8 | 2 | 140 | 50 | 150 | 80 | 300 | |
| | Co-ex 4 | | 10 | 8 | 2 | 150 | 50 | 150 | 80 | 300 | |
| | Co-ex 5 | | 10 | 8 | 2 | 160 | 50 | 150 | 80 | 300 | |
| | Co-ex 6 | | 10 | 8 | 3 | 140 | 50 | 150 | 80 | 300 | |
| | Co-ex 7 | | 10 | 8 | 4 | 140 | 50 | 150 | 80 | 300 | |

The values of color of the coated members 100 of comparative examples 2 to 7 were detected respectively. The values of color of the coated members 100 were shown in Table 6.

TABLE 6

|  | long side L* | long side a* | long side b* | short side L* | short side a* | short side b* |
|---|---|---|---|---|---|---|
| Co-ex 2 | 53.92 | −4.21 | 2.94 | 53.12 | −3.52 | 3.14 |
| Co-ex 3 | 60.84 | −5.96 | 0.96 | 58.55 | −8.42 | 3.45 |
| Co-ex 4 | 65.88 | −10.67 | −1.68 | 75.72 | −12.53 | −10.58 |
| Co-ex 5 | 75.61 | −28.14 | −12.57 | 80.61 | −24.31 | −32.41 |
| Co-ex 6 | 62.51 | 8.55 | −7.52 | 63.43 | 6.71 | −4.65 |
| Co-ex 7 | 63.43 | 11.63 | −24.24 | 67.68 | 14.76 | −30.25 | becomes larger and larger, which is more reddish. But only a single color system and brightness superposition will appear, and a certain regularity and multi-color system color changes cannot be presented.

That is, in the absence of the color layer 20, merely changing the thickness of the interference layer 30 or changing the content of silicon cannot better realize or reflect the effect of the interference layer 30 on light interference.

Example 6

A difference of the parameters between example 6 and example 3 in coating of AlTiSiN interference layer 30 is that: the time for coating the interference layer 30 was 150 min.

Example 7

A difference of the parameters between example 7 and example 3 in coating of AlTiSiN interference layer 30 is that: the time for coating the interference layer 30 was 160 min.

The process parameters of examples 3, 6, and 7 were shown in Table 7.

TABLE 7

|  |  | chromium target (A) | aluminum target (A) | titanium target (A) | silicon target (A) | time (min) | duty ratio (%) | bias voltage (V) | nitrogen (ml/min) | argon (ml/min) | acetylene (ml/min) |
|---|---|---|---|---|---|---|---|---|---|---|---|
| bonding layer (Cr) |  |  |  |  |  |  |  |  |  |  |  |
|  | Ex 3 | 10 |  |  |  | 20 | 70 | 200 | 20 |  |  |
|  | Ex 6 | 10 |  |  |  | 20 | 70 | 200 | 20 |  |  |
|  | Ex 7 | 10 |  |  |  | 20 | 70 | 200 | 20 |  |  |
| color layer (CrCN) |  |  |  |  |  |  |  |  |  |  |  |
|  | Ex 3 | 10 |  |  |  | 140 | 50 | 110 | 20 | 200 | 105 |
|  | Ex 6 | 10 |  |  |  | 140 | 50 | 110 | 20 | 200 | 105 |
|  | Ex 7 | 10 |  |  |  | 140 | 50 | 110 | 20 | 200 | 105 |
| interference layer (AlTiSiN) |  |  |  |  |  |  |  |  |  |  |  |
|  | Ex 3 |  | 10 | 8 | 4 | 140 | 50 | 150 | 80 | 300 |  |
|  | Ex 6 |  | 10 | 8 | 4 | 150 | 50 | 150 | 80 | 300 |  |
|  | Ex 7 |  | 10 | 8 | 4 | 160 | 50 | 150 | 80 | 300 |  |

The values of color of the coated members 100 of example 3 (the time for coating the interference layer 30 was 140 min), example 6 (the time for coating the interference layer 30 was 150 min), and example 7 (the time for coating the interference layer 30 was 160 min) were detected respectively. The values of color of the coated members 100 were shown in Table 8.

TABLE 8

|  | long side L* | long side a* | long side b* | short side L* | short side a* | short side b* |
|---|---|---|---|---|---|---|
| Ex 3 | 53.48 | −16.91 | 5.31 | 53.65 | −16.23 | 7.65 |
| Ex 6 | 49.01 | 24.14 | −8.23 | 48.74 | 18.17 | −9.64 |
| Ex 7 | 48.73 | 13.23 | −17.65 | 49.27 | 10.64 | −24.99 |

According to the Table 8, under the condition that other coating parameters are consistent (especially the same content of silicon), the thickness of the coated member 100 can be changed only by changing the coating time, and the coordinate of L* of the coated member 100 obtained is always at a stable level, the brightness is uniform, and the gloss is good. The value of color is converted by a formula that hue angle h=arctan(b*/a*). In example 3, the hue angle on the long side is 162.6°, the hue angle on the short side is 154.8°, and the coated member 100 is bean-green. In example 6, the hue angle on the long side is 341.2°, the hue angle on the short side is 332.1°, and the coated member 100 is wine-red. In example 7, the hue angle on the long side is 306.9°, the hue angle on the short side is 293.1°, and the coated member 100 is lavender. Although the coating time is gradually increasing, the hue angles of examples 3, 6, and 7 first increase and then decrease, rather than a single linear change. The colors of the coated member 100 are green, red, and purple, respectively. As the coating time is different, the thickness of the interference layer 30 will be different. When the interference layer 30 has different thicknesses, the interference degree of the light will also be different. Thus, the different color systems of the coated members 100 are also different, that is, the aluminum titanium silicon nitride (AlTiSiN) interference layer 30 is coated, the different colors of the coated members 100 as the thickness of the interference layer 30 changes.

Example 8

A difference between example 8 and example 3 (the color layer 20 is a chromium carbon nitride (CrCN) layer) is that: the color layer 20 is a chromium silicon carbon nitride (CrSiCN) layer.

The color layer 20 is a chromium silicon carbon nitride (CrSiCN) layer: using the chromium target and the silicon target, the current of the chromium target was 10 A, the current of the silicon target was 4 A, a duty ratio was adjusted to 50%, and a bias voltage of 110V was applied to the substrate 10. Continuously inject acetylene gas at a flow rate of 105 mL/min, nitrogen gas at a flow rate of 20 mL/min, and argon gas at a flow rate of 200 mL/min into a coating chamber. A time for coating the color layer 20 was 140 min. The color space range presented by the color layer 20 with long side L* is 49.7, and short side L* is 51.2.

Coating an aluminum titanium silicon nitride (AlTiSiN) interference layer 30 on the surface of the color layer 20: using the aluminum target, the titanium target and the silicon target, the current of the aluminum target was 10 A, the current of the titanium target was 8 A, the current of the silicon target was 4 A, the duty ratio was adjusted to 50%, and the bias voltage of 150V was applied to the substrate 10. Continuously inject nitrogen gas at a flow rate of 80 mL/min, and argon gas at a flow rate of 300 mL/min into the coating chamber. The time for coating the interference layer 30 was 140 min.

Example 9

A difference of the parameters between example 9 and example 8 in coating of aluminum titanium silicon nitride (AlTiSiN) interference layer 30 is that: the time for coating the interference layer 30 was 150 min.

Example 10

A difference of the parameters between example 10 and example 8 in coating of aluminum titanium silicon nitride (AlTiSiN) interference layer 30 is that: the time for coating the interference layer 30 was 160 min.

The process parameters of examples 3, 6, 7, 8, 9 and 10 were shown in Table 9.

TABLE 9

| | chromium target (A) | aluminum target (A) | titanium target (A) | silicon target (A) | time (min) | duty ratio (%) | bias voltage (V) | nitrogen (ml/min) | argon (ml/min) | acetylene (ml/min) |
|---|---|---|---|---|---|---|---|---|---|---|
| bonding layer (Cr) | | | | | | | | | | |
| Ex 3 | 10 | | | | 20 | 70 | 200 | 20 | | |
| Ex 6 | 10 | | | | 20 | 70 | 200 | 20 | | |
| Ex 7 | 10 | | | | 20 | 70 | 200 | 20 | | |
| Ex 8 | 10 | | | | 20 | 70 | 200 | 20 | | |
| Ex 9 | 10 | | | | 20 | 70 | 200 | 20 | | |
| Ex 10 | 10 | | | | 20 | 70 | 200 | 20 | | |
| color layer | | | | | | | | | | |
| Ex 3 | 10 | | | | 140 | 50 | 110 | 20 | 200 | 105 |
| Ex 6 | 10 | | | | 140 | 50 | 110 | 20 | 200 | 105 |
| Ex 7 | 10 | | | | 140 | 50 | 110 | 20 | 200 | 105 |
| Ex 8 | 10 | | | 4 | 140 | 50 | 110 | 20 | 200 | 105 |
| Ex 9 | 10 | | | 4 | 140 | 50 | 110 | 20 | 200 | 105 |
| Ex 10 | 10 | | | 4 | 140 | 50 | 110 | 20 | 200 | 105 |
| interference layer (AlTiSiN) | | | | | | | | | | |
| Ex 3 | | 10 | 8 | 4 | 140 | 50 | 150 | 80 | 300 | |
| Ex 6 | | 10 | 8 | 4 | 150 | 50 | 150 | 80 | 300 | |
| Ex 7 | | 10 | 8 | 4 | 160 | 50 | 150 | 80 | 300 | |
| Ex 8 | | 10 | 8 | 4 | 140 | 50 | 150 | 80 | 300 | |
| Ex 9 | | 10 | 8 | 4 | 150 | 50 | 150 | 80 | 300 | |
| Ex 10 | | 10 | 8 | 4 | 160 | 50 | 150 | 80 | 300 | |

The values of color of the coated members 100 of example 8 (the time for coating the interference layer 30 was 140 min), example 9 (the time for coating the interference layer 30 was 150 min), and example 10 (the time for coating the interference layer 30 was 160 min) were detected respectively. The values of color of the coated members 100 were shown in Table 10.

TABLE 10

| | long side L* | long side a* | long side b* | short side L* | short side a* | short side b* |
|---|---|---|---|---|---|---|
| Ex 3 | 53.48 | −16.91 | 5.31 | 53.65 | −16.23 | 7.65 |
| Ex 6 | 49.01 | 24.14 | −8.23 | 48.74 | 18.17 | −9.64 |
| Ex 7 | 48.73 | 13.23 | −17.65 | 49.74 | 10.64 | −24.99 |
| Ex 8 | 49.58 | 6.34 | 8.12 | 45.75 | 12.64 | 11.22 |
| Ex 9 | 47.85 | 14.77 | −14.73 | 53.83 | 22.53 | −10.58 |
| Ex 10 | 48.61 | 0.49 | −36.08 | 48.92 | −4.31 | −32.41 |

According to the Table 10, the value of color is converted by the formula hue angle h=arctan(b*/a*). In example 8, the hue angle on the long side is 52°, the hue angle on the short side is 41.6°, and the coated member 100 is champagne gold. In example 9, the hue angle on the long side is 315.1°, the hue angle on the short side is 334.8°, and the coated member 100 is lavender. In example 10, the hue angle on the long side is 270.3°, the hue angle on the short side is 262.45°, and the coated member 100 is light sky blue. Although examples 8-10 are compared with examples 3, 6, and 7, the color layer 20 is changed from a chromium carbonitride layer (CrCN) to a chromium silicon carbonitride layer (CrSiCN), the coordinate of L* of the coated member 100 is always at a stable level, the brightness is uniform, and the gloss is good. However, the value of a* and b* have changed to a certain extent, which indicates that the change of the element composition of the color layer 20 has a certain effect on the color of the coated member 100.

According to the Table 10, with the increase of the coating time, the hue angle of examples 8 to 10 also increased first and then decreased. The color of the coated member 100 changed from brown to purple and then to blue. Since a composite layer structure composed of the color layer 20 of chromium silicon carbon nitride (CrCSiN) and the interference layer 30 of aluminum titanium silicon nitride (AlTi-SiN), which can also interfere with light. At the same time, as the coating time is different, the thickness of the interference layer 30 will also be different, and the degree of interference to light will also be different, thus the color system of the different coated members 100 will be different. That is, when the color layer 20 is a chromium silicon carbon nitride layer (CrCSiN), the aluminum titanium silicon nitride (AlTiSiN) interference layer 30 is coated, the different colors of the coated members 100 as the thickness of the interference layer 30 changes.

Example 11

A difference between example 11 and example 8 (The interference layer 30 is aluminum titanium silicon nitride (AlTiSiN)) is that: the interference layer 30 is aluminum titanium nitride (AlTiN).

Coating the aluminum titanium nitride (AlTiN) interference layer 30 on the surface of the color layer 20: using the aluminum target and the titanium target, the current of the aluminum target was 10 A, the current of the titanium target was 8 A, the duty ratio was adjusted to 50%, and the bias voltage of 150V was applied to the substrate 10. Continuously inject nitrogen gas at a flow rate of 100 mL/min, and argon gas at a flow rate of 300 mL/min into the coating chamber. The time for coating the interference layer 30 was 140 min.

Example 12

A difference of the parameters between example 12 and example 11 in coating of aluminum titanium nitride (AlTiN) interference layer 30 is that: The time for coating the interference layer 30 was 150 min.

Example 13

A difference of the parameters between example 13 and example 11 in coating of aluminum titanium nitride (AlTiN) interference layer 30 is that: The time for coating the interference layer 30 was 160 min.

The process parameters of examples 8 to 13 were shown in Table 11.

TABLE 11

| | | chromium target (A) | aluminum target (A) | titanium target (A) | silicon target (A) | time (min) | duty ratio (%) | bias voltage (V) | nitrogen (ml/min) | argon (ml/min) | acetylene (ml/min) |
|---|---|---|---|---|---|---|---|---|---|---|---|
| bonding layer (Cr) | | | | | | | | | | | |
| | Ex 8 | 10 | | | | 20 | 70 | 200 | 20 | | |
| | Ex 9 | 10 | | | | 20 | 70 | 200 | 20 | | |
| | Ex 10 | 10 | | | | 20 | 70 | 200 | 20 | | |
| | Ex 11 | 10 | | | | 20 | 70 | 200 | 20 | | |
| | Ex 12 | 10 | | | | 20 | 70 | 200 | 20 | | |
| | Ex 13 | 10 | | | | 20 | 70 | 200 | 20 | | |
| color layer (CrSiCN) | | | | | | | | | | | |
| | Ex 8 | 10 | | | 4 | 140 | 50 | 110 | 20 | 200 | 105 |
| | Ex 9 | 10 | | | 4 | 140 | 50 | 110 | 20 | 200 | 105 |
| | Ex 10 | 10 | | | 4 | 140 | 50 | 110 | 20 | 200 | 105 |
| | Ex 11 | 10 | | | 4 | 140 | 50 | 110 | 20 | 200 | 105 |
| | Ex 12 | 10 | | | 4 | 140 | 50 | 110 | 20 | 200 | 105 |
| | Ex 13 | 10 | | | 4 | 140 | 50 | 110 | 20 | 200 | 105 |
| interference layer | | | | | | | | | | | |
| | Ex 8 | | 10 | 8 | 4 | 140 | 50 | 150 | 80 | 300 | |
| | Ex 9 | | 10 | 8 | 4 | 150 | 50 | 150 | 80 | 300 | |
| | Ex 10 | | 10 | 8 | 4 | 160 | 50 | 150 | 80 | 300 | |
| | Ex 11 | | 10 | 8 | | 140 | 50 | 150 | 80 | 300 | |
| | Ex 12 | | 10 | 8 | | 150 | 50 | 150 | 80 | 300 | |
| | Ex 13 | | 10 | 8 | | 160 | 50 | 150 | 80 | 300 | |

The values of color of the coated members 100 of example 11 (the time for coating the interference layer 30 was 140 min), example 12 (the time for coating the interference layer 30 was 150 min), and example 13 (the time for coating the interference layer 30 was 160 min) were detected respectively. The values of color of the coated members 100 were shown in Table 12.

TABLE 12

| | long side L* | long side a* | long side b* | short side L* | short side a* | short side b* |
|---|---|---|---|---|---|---|
| Ex 8 | 49.58 | 6.34 | 8.12 | 45.75 | 12.64 | 11.22 |
| Ex 9 | 47.85 | 14.77 | −14.73 | 53.83 | 22.53 | −10.58 |
| Ex 10 | 48.61 | 0.49 | −36.08 | 48.92 | −4.31 | −32.41 |

TABLE 12-continued

| | long side L* | long side a* | long side b* | short side L* | short side a* | short side b* |
|---|---|---|---|---|---|---|
| Ex 11 | 51.81 | 9.64 | 13.32 | 50.35 | 11.87 | 10.17 |
| Ex 12 | 49.82 | 18.17 | −24.99 | 52.63 | 19.05 | −20.76 |
| Ex 13 | 46.52 | 5.74 | −34.11 | 51.56 | −1.45 | −34.12 |

According to the Table 12, the value of color is converted by the formula hue angle h=arctan(b*/a*). In example 11, the hue angle on the long side is 54.1°, the hue angle on the short side is 40.6°, and the coated member 100 is yellow silver. In example 12, the hue angle on the long side is 306.0°, the hue angle on the short side is 312.5°, and the coated member 100 is purple. In example 13, the hue angle on the long side is 279.6°, the hue angle on the short side is 267.6°, and the coated member 100 is pink blue. The hue angle of examples 11 to 13 first became larger and then smaller, and the color of the coated member 100 changed from brown to purple and then to blue.

According to the Table 12, referring to examples 11-13, when only the element composition of the interference layer 30 is changed, that is, only the silicon element in the interference layer 30 is removed, the coated member 100 is coated with the aluminum titanium nitride (AlTiN) layer, and the thickness of the interference layer 30 is different by adjusting the coating time, and the color of the coated member 100 is also different. That is, after the aluminum titanium nitride (AlTiN) interference layer 30 is coated, the different colors of the coated members 100 can be obtained according to the thickness of the interference layer 30.

Figure 10:
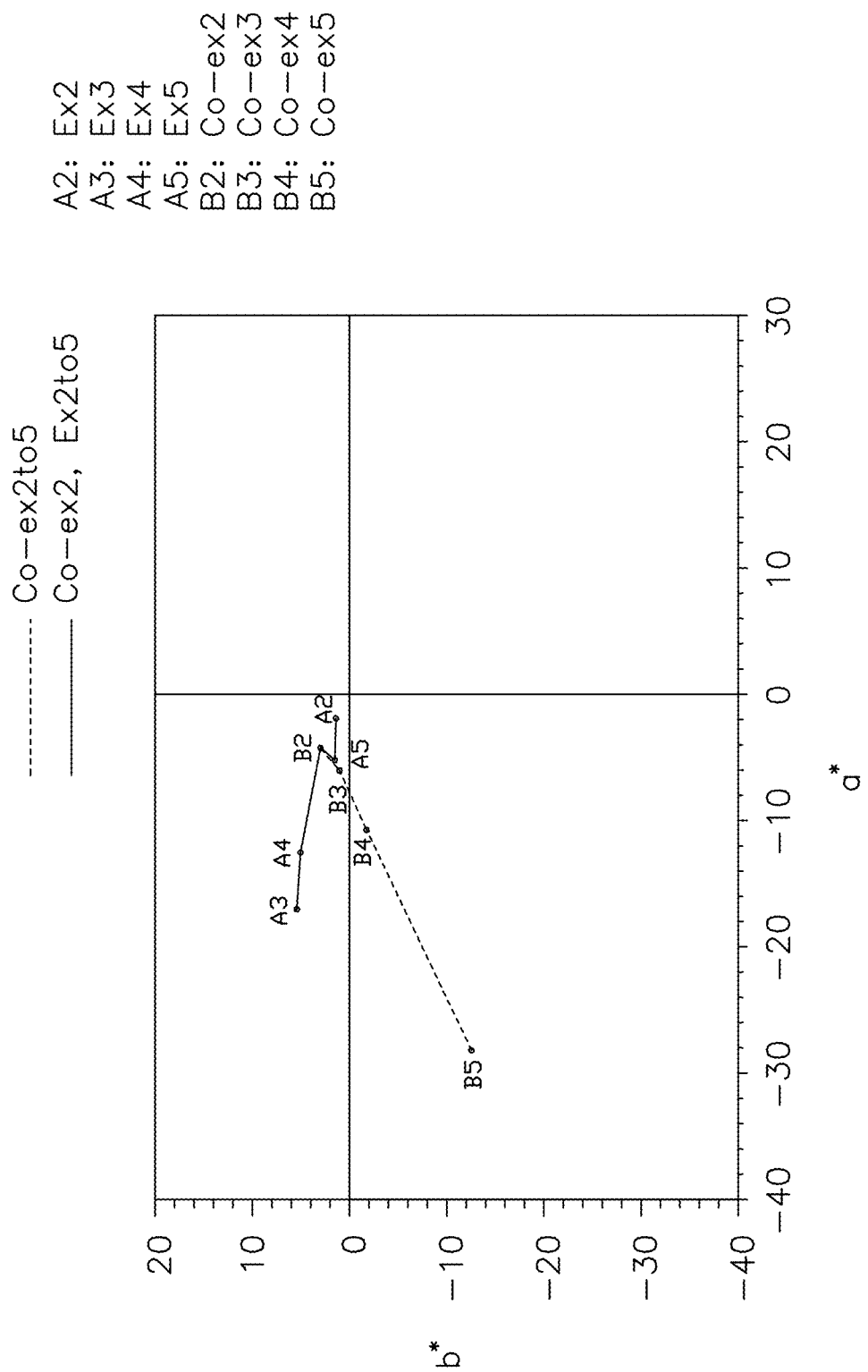
FIG. 10 is a broken line diagram of the color values of the coated member in examples 2 to 5 and comparative examples 2 to 5.

Referring to FIG. 10, FIG. 10 is a broken line diagram of the color values of the coated member in examples 2 to 5 and comparative examples 2 to 5. An abscissa is a* value at the long side of the corresponding coated member 100, and an ordinate is the b* value at the long side of the corresponding coated member 100.

Referring to the broken line corresponded to comparative example 2 and examples 2 to 5 in FIG. 10, according to an order of example 2, example 5, comparative example 2, example 4, and example 3, the content of silicon element increased sequentially from zero. As the content of silicon increases, the a* value decreases as a whole, and the b* value increases. The addition of silicon element can cause the interference layer 30 have a certain interference effect, and with the different content of silicon, the interference effect and the color of the coated member are also different.

Referring to the broken line corresponded to comparative examples 2 to 5 in FIG. 10. The presence of the color layer 20 of comparative example 2 and the absence of the color layer 20 of comparative example 3 cause the color of the coated member different. Both the a* value and the b* value of comparative examples 3 to 5 are decreasing, and the line of the values of color in comparative examples 3 to 5 is roughly straight. In the CIE LAB color system, the colors of comparative examples 3 to 5 are all in the green system and cannot show the color change of the multi-color system.

Figure 11:
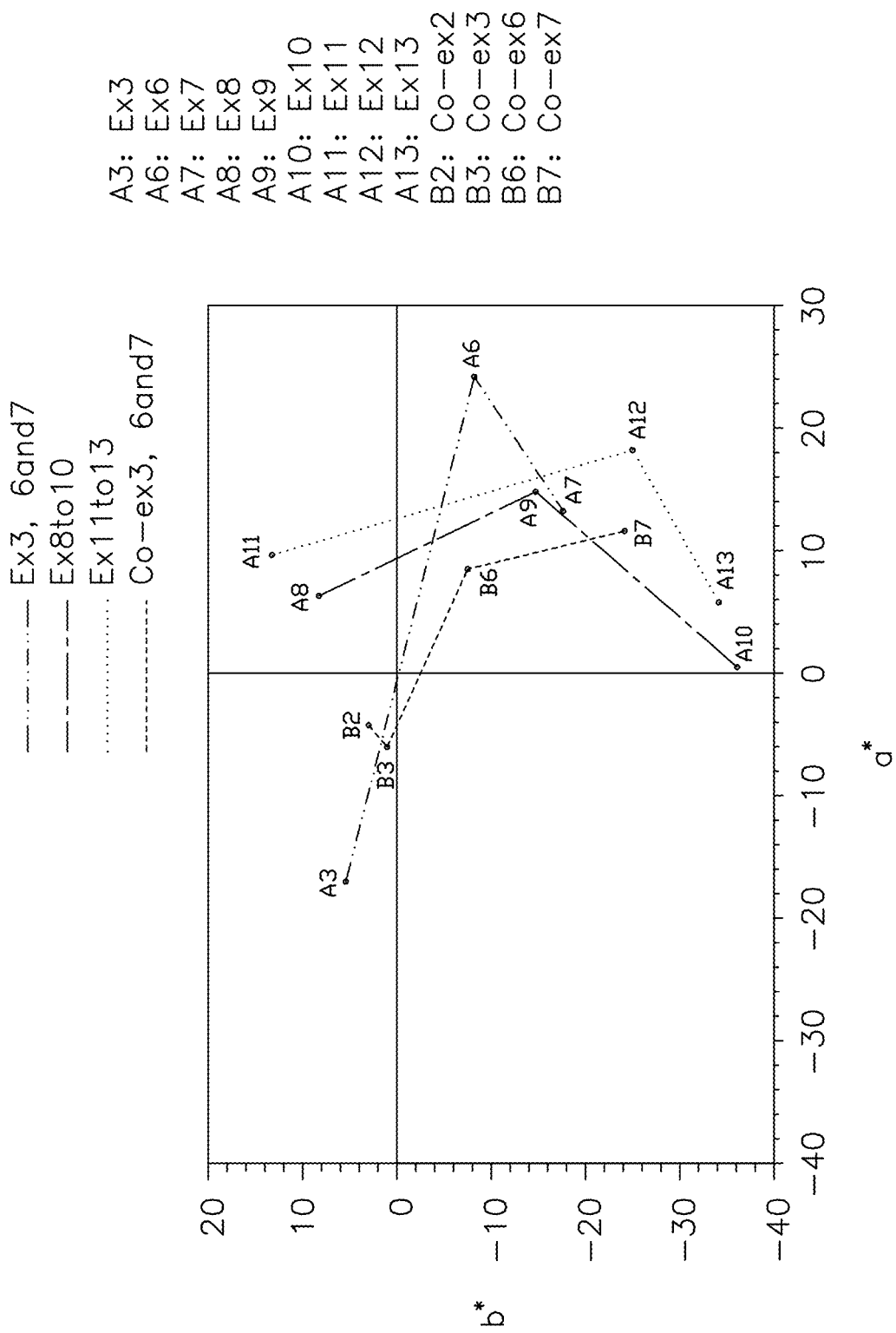
FIG. 11 is a broken line diagram of the color values of the coated member in examples 3, 6 to 13 and comparative examples 3, 6, and 7.

Referring to FIG. 11, FIG. 11 is a broken line diagram of the color values of the coated member in examples 3, 6 to 13 and comparative examples 3, 6, and 7. An abscissa is the a* value at the long side of the corresponding coated member 100, and an ordinate is the b* value at the long side of the corresponding coated member 100.

Referring to FIG. 11, in comparative examples 3, 6, and 7, the a* value gradually increased, and the b* value gradually decreased. The color changes of comparative examples 3, 6 and 7 are small and mostly close to red.

Referring to FIG. 11, in examples 3, 6, and 7, the a* value first increased and then decreased, and the b* value gradually decreased. The numerical changes of examples 3, 6 and 7 are non-linear changes and exhibit different color systems.

Referring to the broken line corresponded to examples 8 to 10 in FIG. 11, the a* value first increased and then decreased, and the b* value gradually decreased. The numerical changes of examples 8 to 10 are non-linear changes and exhibit different color systems.

Referring to the broken line corresponded to examples 11 to 13 in FIG. 11, the a* value first increased and then decreased, and the b* value gradually decreased. The numerical changes of examples 11 to 13 are non-linear changes and exhibit different color systems.

In summary, it can be seen that the color layer 20 and the interference layer 30 are added, as the process conditions change, for example, the content of silicon in the interference layer 30 is changed, the element composition in the interference layer 30 or the color layer 20 is changed, or the thickness of interference layer 30 is changed, causing the color of the coated member 100 different. In particular, the thickness of the interference layer 30 changed by changing the coating time, the color of the coated member 100 is greatly changed, and the coated member 100 of different colors can be obtained.

The following examples are given for the color of the coated member 100 composed of different thicknesses of the interference layer 30.

When the thickness of the interference layer 30 is 22 nm, the a* value is −38.4, and the b* value is +71.3 of the coated member 100 in the CIE LAB color system. The coated member 100 appears yellowish silver.

When the thickness of the interference layer 30 is 24 nm, the a* value is −22.5, and the b* value is +84.7 of the coated member 100 in the CIE LAB color system. The coated member 100 appears golden.

When the thickness of the interference layer 30 is 31 nm, the a* value is +51.2, and the b* value is +48.5 of the coated member 100 in the CIE LAB color system. The coated member 100 appears positive red.

When the thickness of the interference layer 30 is 36 nm, the a* value is +53.8, and the b* value is −27.1 of the coated member 100 in the CIE LAB color system. The coated member 100 appears rose red.

When the thickness of the interference layer 30 is 41 nm, the a* value is +36.9, and the b* value is −60.2 of the coated member 100 in the CIE LAB color system. The coated member 100 appears purple.

When the thickness of the interference layer 30 is 53 nm, the a* value is −49.8, and the b* value is −81.7 of the coated member 100 in the CIE LAB color system. The coated member 100 appears telecom blue.

When the thickness of the interference layer 30 is 66 nm, the a* value is −61.3 and the b* value is −32.6 of the coated member 100 in the CIE LAB color system. The coated member 100 appears tender green.

When the thickness of the interference layer 30 is 76 nm, the a* value is −74.7, and the b* value is +21.5 of the coated member 100 in the CIE LAB color system. The coated member 100 appears gem green.

When the thickness of the interference layer 30 is 83 nm, the a* value is −30.1, and the b* value is +89.2 of the coated member 100 in the CIE LAB color system. The coated member 100 appears corona yellow.

When the thickness of the interference layer 30 is 97 nm, the a* value is −22.5, and the b* value is +90.4 of the coated member 100 in the CIE LAB color system. The coated member 100 appears yellow.

The parameters used in the embodiments, such as coating time, current applied to each target, gas flow, bias, etc., and the thickness of the formed coated member 100 can be adjusted and changed according to actual requirements. For example, in the embodiments, the current applied to the aluminum target was 10 A, and the current applied to the titanium target was 8 A, so that the ratio of aluminum to titanium in the interference layer 30 was between 2.5:7 to 3.5:7. When the current applied to the aluminum target changes, the current applied to the titanium target can be adjusted accordingly, so that the ratio of aluminum to titanium in the interference layer 30 is between 2.5:7 to 3.5:7.

By adjusting the thickness of the interference layer 30 to adjust the interference to light to exhibit the characteristics of a wide color space, the method of coating is relatively simple. And the multiple doping of aluminum titanium silicon nitride (AlTiSiN) can reduce the friction resistance of the interference layer 30 and improve the mechanical properties.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:
1. A coated member comprising:
a substrate;
a color layer formed on a surface of the substrate; and
an interference layer formed on a surface of the color layer;

wherein the color layer comprises chromium atoms and carbon atoms, and a mass ratio of the carbon atoms in the color layer is 20% to 60%, causing a color coordinate L* of the color layer in a CIE LAB color system to be within a preset range of 40≤L*≤60;

the interference layer comprises aluminum atoms, titanium atoms, and nitrogen atoms, a mass ratio of the aluminum atoms to the titanium atoms in the interference layer is in a range from 2.5:7 to 3.5:7, for enabling the interference layer having a higher interference effect with light and a high chemical stability; and the color layer is configured to selectively re-reflect and refract natural light entering the interference layer; the interference layer is configured to interfere with a light reflected from the color layer, thus allowing the coated member to present a final color; when the coordinate L* is within the preset range, the final color of the coated member is the same as or different from a color of the color layer.

2. The coated member of claim 1, wherein a thickness of the interference layer is 20 nm to 100 nm, and as the thickness of the interference layer gradually increases, the color of the coated member gradually changes from yellow to red, from red to blue, from blue to green, and finally from green to yellow in the CIE LAB color system.

3. The coated member of claim 1, wherein
when the thickness of the interference layer gradually increases from 20 nm to 30 nm, an a* value of the coated member in the CIE LAB color system gradually increases within a first color scale, and a b* value is within a second color scale;
when the thickness of the interference layer gradually increases from 30 nm to 40 nm, the a* value of the coated member in the CIE LAB color system is within a third color scale, and the b* value gradually decreases within a fourth color scale;
when the thickness of the interference layer gradually increases from 40 nm to 60 nm, the a* value of the coated member in the CIE LAB color system gradually decreases within a fifth color scale, and the b* value is within a sixth color scale;
when the thickness of the interference layer gradually increases from 60 nm to 80 nm, the a* value of the coated member in the CIE LAB color system is within a seventh color scale, and the b* value gradually increases within an eighth color scale; and
when the thickness of the interference layer gradually increases from 80 nm to 100 nm, the a* value of the coated member in the CIE LAB color system gradually increases within a ninth color scale, and the b* value is within a tenth color scale.

4. The coated member of claim 2, wherein
when the thickness of the interference layer gradually increases from 20 nm to 30 nm, an a* value of the coated member in the CIE LAB color system gradually increases within a first color scale, and a b* value is within a second color scale;
when the thickness of the interference layer gradually increases from 30 nm to 40 nm, the a* value of the coated member in the CIE LAB color system is within a third color scale, and the b* value gradually decreases within a fourth color scale;
when the thickness of the interference layer gradually increases from 40 nm to 60 nm, the a* value of the coated member in the CIE LAB color system gradually decreases within a fifth color scale, and the b* value is within a sixth color scale;
when the thickness of the interference layer gradually increases from 60 nm to 80 nm, the a* value of the coated member in the CIE LAB color system is within a seventh color scale, and the b* value gradually increases within an eighth color scale; and
when the thickness of the interference layer gradually increases from 80 nm to 100 nm, the a* value of the coated member in the CIE LAB color system gradually increases within a ninth color scale, and the b* value is within a tenth color scale.

5. The coated member of claim 1, wherein the color layer is at least one of a chromium carbon layer, a chromium carbon nitride layer, and a chromium silicon carbon nitride layer.

6. The coated member of claim 1, wherein the interference layer further comprises silicon atoms.

7. The coated member of claim 6, wherein the coated member further comprises a bonding layer formed between the substrate and the color layer.

8. The coated member of claim 7, wherein the bonding layer is a chromium layer or a titanium layer.

9. An electronic device comprising: a housing;
the housing comprising:
a coated member,
the coated member comprising:
a substrate;
a color layer formed on a surface of the substrate; and
an interference layer formed on a surface of the color layer;
wherein the color layer comprises chromium atoms and carbon atoms, and a mass ratio of the carbon atoms in the color layer is 20% to 60%, causing a color coordinate L* of the color layer in a CIE LAB color system to be within a preset range of 40≤L*≤60;
wherein the interference layer comprises aluminum atoms, titanium atoms, and nitrogen atoms, a mass ratio of the aluminum atoms to the titanium atoms in the interference layer is in a range from 2.5:7 to 3.5:7, for enabling the interference layer having a higher interference effect with light and a high chemical stability; and
the color layer is configured to selectively re-reflect and refract natural light entering the interference layer; the interference layer is configured to interfere with a light reflected from the color layer, thus allowing the coated member to present a final color; when the coordinate L* is within the preset range, the final color of the coated member is the same as or different from a color of the color layer.

* * * * *